(12) United States Patent
Rowley et al.

(10) Patent No.: US 9,166,543 B2
(45) Date of Patent: Oct. 20, 2015

(54) CIRCUITS AND METHODS FOR COMPENSATING FOR MILLER CAPACITANCE

(71) Applicant: Texas Instruments Incorporated, Dallas, TX (US)

(72) Inventors: Matthew David Rowley, Parker, TX (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 250 days.

(21) Appl. No.: 13/864,111

(22) Filed: Apr. 16, 2013

(65) Prior Publication Data
US 2014/0306764 A1 Oct. 16, 2014

(51) Int. Cl.
*H03F 1/14* (2006.01)
*H03F 3/45* (2006.01)

(52) U.S. Cl.
CPC .............. *H03F 3/45188* (2013.01); *H03F 1/14* (2013.01)

(58) Field of Classification Search
USPC .......................................... 330/292, 302, 277

IPC .......................................................... H03F 1/14
See application file for complete search history.

(56) References Cited

U.S. PATENT DOCUMENTS

| | | | | |
|---|---|---|---|---|
| 4,122,364 A * | 10/1978 | Yano | ............................. | 327/246 |
| 6,201,442 B1 * | 3/2001 | James et al. | .................. | 330/107 |
| 6,577,185 B1 * | 6/2003 | Chandler et al. | .................. | 330/9 |
| 2003/0210092 A1 * | 11/2003 | Mehr et al. | ......................... | 330/9 |
| 2006/0044066 A1 * | 3/2006 | Forbes et al. | ........................ | 330/292 |
| 2009/0202022 A1 * | 8/2009 | Kaczman et al. | ............. | 375/319 |
| 2011/0181357 A1 * | 7/2011 | Abdelli et al. | ................ | 330/254 |
| 2013/0127526 A1 * | 5/2013 | Sayuk | ............................... | 330/9 |

* cited by examiner

*Primary Examiner* — Patricia T Nguyen
(74) *Attorney, Agent, or Firm* — John R. Pessetto; Charles A. Brill; Frank D. Cimino

(57) ABSTRACT

Amplifier circuits and methods of cancelling the Miller effects in amplifiers are disclosed herein. An embodiment of an amplifier circuit includes an input and an output. An amplifier is connected between the input and the output of the circuit. A voltage source is connected to the output, wherein the voltage source output is one hundred eighty degrees out of phase with the voltage output by the amplifier, and wherein the voltage source cancels gain due to the Miller effect of a Miller capacitance between the input and output.

7 Claims, 3 Drawing Sheets

CIRCUITS AND METHODS FOR COMPENSATING FOR MILLER CAPACITANCE

BACKGROUND

Capacitors located across amplifier gain stages (whether inherent in a given topology or discretely placed) cause the amplifiers to suffer from what is known as the Miller effect. The Miller effect multiplies the given capacitance value by the value of gain across the stage; thus resulting in a larger effective capacitance as seen looking into the amplifier input. This capacitance has the effect of lowering the pole frequency at the gain stage input due to the higher capacitance. The result is a lower bandwidth for the amplification stage.

SUMMARY

Amplifier circuits and methods of cancelling the Miller effects in amplifiers are disclosed herein. An embodiment of an amplifier circuit includes an input and an output. An amplifier is connected between the input and the output of the circuit. A voltage source is connected to the output, wherein the voltage source output is one hundred eighty degrees out of phase with the voltage output by the amplifier, and wherein the voltage source cancels gain due to the Miller effect of a Miller capacitance between the input and output.

DETAILED DESCRIPTION

Circuits and methods to compensate for the Miller effect in amplifiers are disclosed herein. The Miller effect amplifies a capacitance located across the gain stage of an amplifier, such as a field effect transistor (FET). The term "Miller capacitance" as used herein refers to capacitance across the gain stage, such as the gate to drain nodes, of an amplifier that is subject to the Miller effect. The Miller capacitance may be an internal capacitance that is the result of the components in the amplifier. For example, the physical layout of a FET may create a capacitance between the gate and drain, which may be the gain stage of an amplifier using the FET. Accordingly, this capacitance is a Miller capacitance and is subject to the Miller effect. The Miller effect amplifies the Miller capacitance by the amount of gain of the amplifier and thus reduces the effective pole locations. The result of the reduced pole locations lowers the circuit bandwidth of the amplifier. By compensating for or cancelling the Miller effect, the pole locations are increased in frequency, which maintains or improves the bandwidth of the amplifiers.

Figure 1:
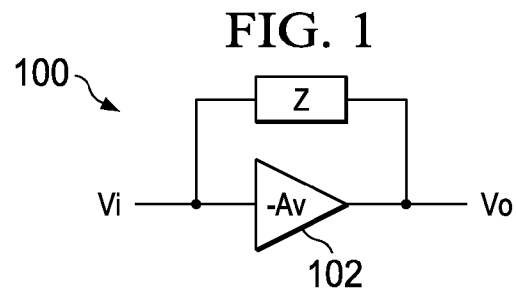
FIG. 1 is a schematic diagram of an amplifier.

An example of a Miller capacitance is shown by the amplifier circuit 100 of FIG. 1. The amplifier circuit 100 includes an amplifier 102 having a gain −Av. The amplifier circuit 100 has an input Vi and an output Vo, wherein the ideal gain is the ratio of voltage at the output Vo to the voltage at the input Vi. The amplifier circuit 100 has an impedance, Z, in the feedback between the input Vi and the output Vo. In the embodiment described herein, the impedance Z is capacitive, so the value of the impedance is the inverse of sC, wherein C is the value of the capacitance. The input impedance Zin is equal to the inverse of $sC_M$, wherein $C_M$ is the Miller capacitance. It follows that the Miller capacitance due to the Miller effect is equal to the input capacitance C multiplied by the sum of one plus the amplifier gain. Based on the foregoing, the input capacitance is amplified by an amount that is proportional to the gain of the amplifier. The increased capacitance produces a pole at the input and reduces the bandwidth at the input.

Figure 2:
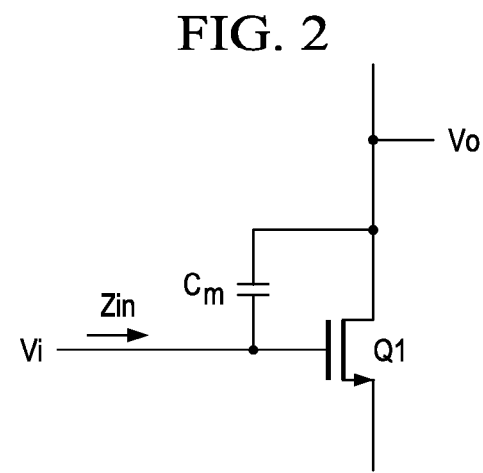
FIG. 2 is a schematic diagram of a single stage transistor amplifier showing a Miller capacitance between the gate and drain.

FIG. 2 is a schematic diagram of a single transistor amplifier having a Miller capacitance Cm across the gate/drain connection of a transistor Q1. The transistor Q1 gain stage is between the transistor gate and drain. As with FIG. 1, the Miller effect amplifies the value of the Miller capacitance Cm across the gate and drain of the transistor Q1 and introduces a pole that limits the bandwidth of the transistor Q1. By limiting the bandwidth of the transistor Q1, the bandwidth of the amplifier 100 is also limited. As described below, the Miller effect presents problems when transistors are used in more complex circuits, such as differential amplifiers, because the Miller effect limits the bandwidth of the amplifiers.

Figure 3:
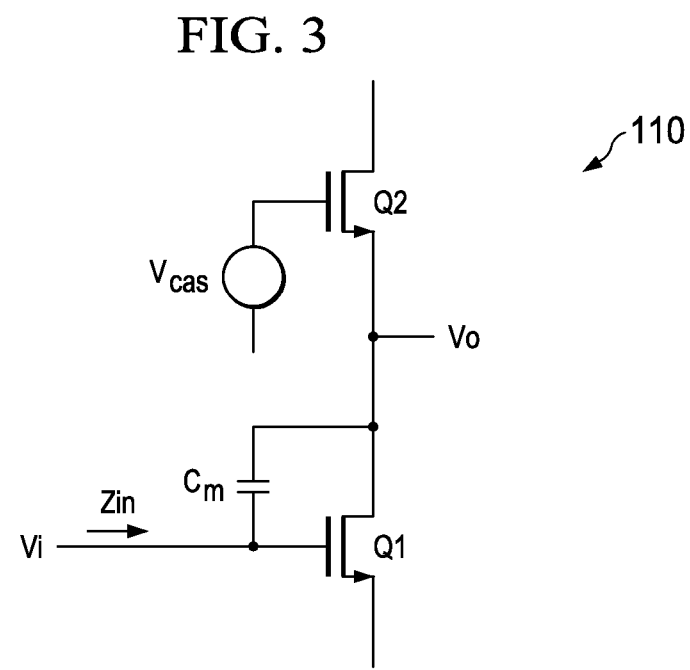
FIG. 3 is a schematic diagram of the transistor amplifier of FIG. 2 with the addition of a cascode gain stage to cancel the Miller effect in the amplifier.

FIG. 3 shows the transistor Q1 in an amplifier circuit 110 with the transistor Q2 in cascode configuration. The gate of the transistor Q2 is biased with an input voltage Vcas. The voltage Vcas is dynamic, meaning that it can change to follow the gain related to the Miller effect associated with the capacitance Cm. As described in greater detail, the amplifier circuit 110 serves to cancel the Miller effect related to the capacitance Cm by modulating the output of the transistor Q2 out of phase with the gain phase of Q1. Thus, the transistor Q2 is dynamically biased so as to cancel the effects of the Miller capacitance Cm.

As briefly described above, the amplifier circuit 110 cancels the effects of the Miller capacitance. More specifically, the voltage Vcas cancels the voltage movement at the drain of the transistor Q1, which is caused by the Miller effect. The transistor Q1 acts as an inverting amplifier between the gate and the drain. The transistor Q2 acts as a non-inverting amplifier between the gate and the source. Therefore, by applying signals at the gates of the transistor Q1 and Q2 that are in phase, the resultant voltage change at the drain of the transistor Q1 can be set to cancel each other out. The in-phase voltage at the source of the transistor Q2 cancels the out-of-phase voltage at the drain of the transistor Q1. Therefore, the gain of the transistor Q1 as seen by the Miller capacitance Cm is cancelled. In some embodiments, Vcas is moved more than the voltage at the drain of Q1, which makes the Miller capacitance Cm appear inductive, so that the feedback by way of the Miller capacitance Cm becomes positive instead of negative. The result is a peak in the transfer function between Vi and Vo along with increased bandwidth.

Figure 4:
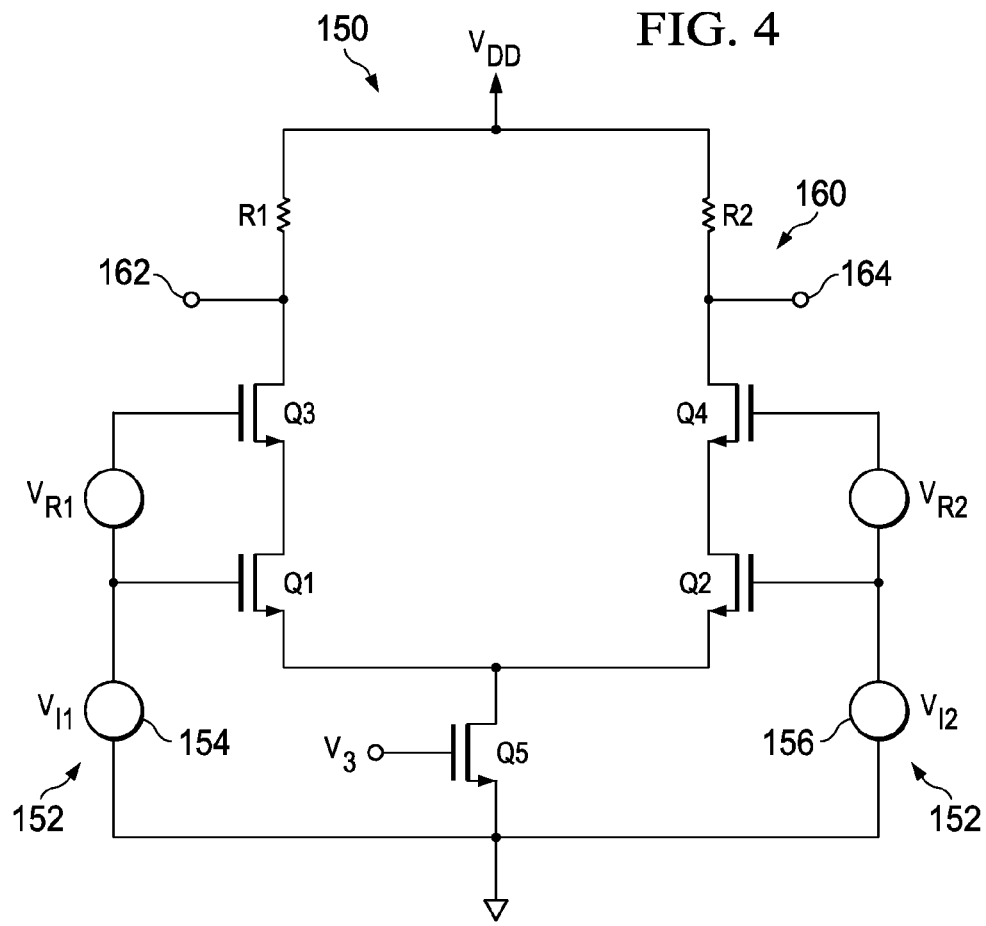
FIG. 4 is a schematic diagram of a differential amplifier using dynamically biased cascode stages to cancel the Miller effect in the amplifier.
Figure 6:
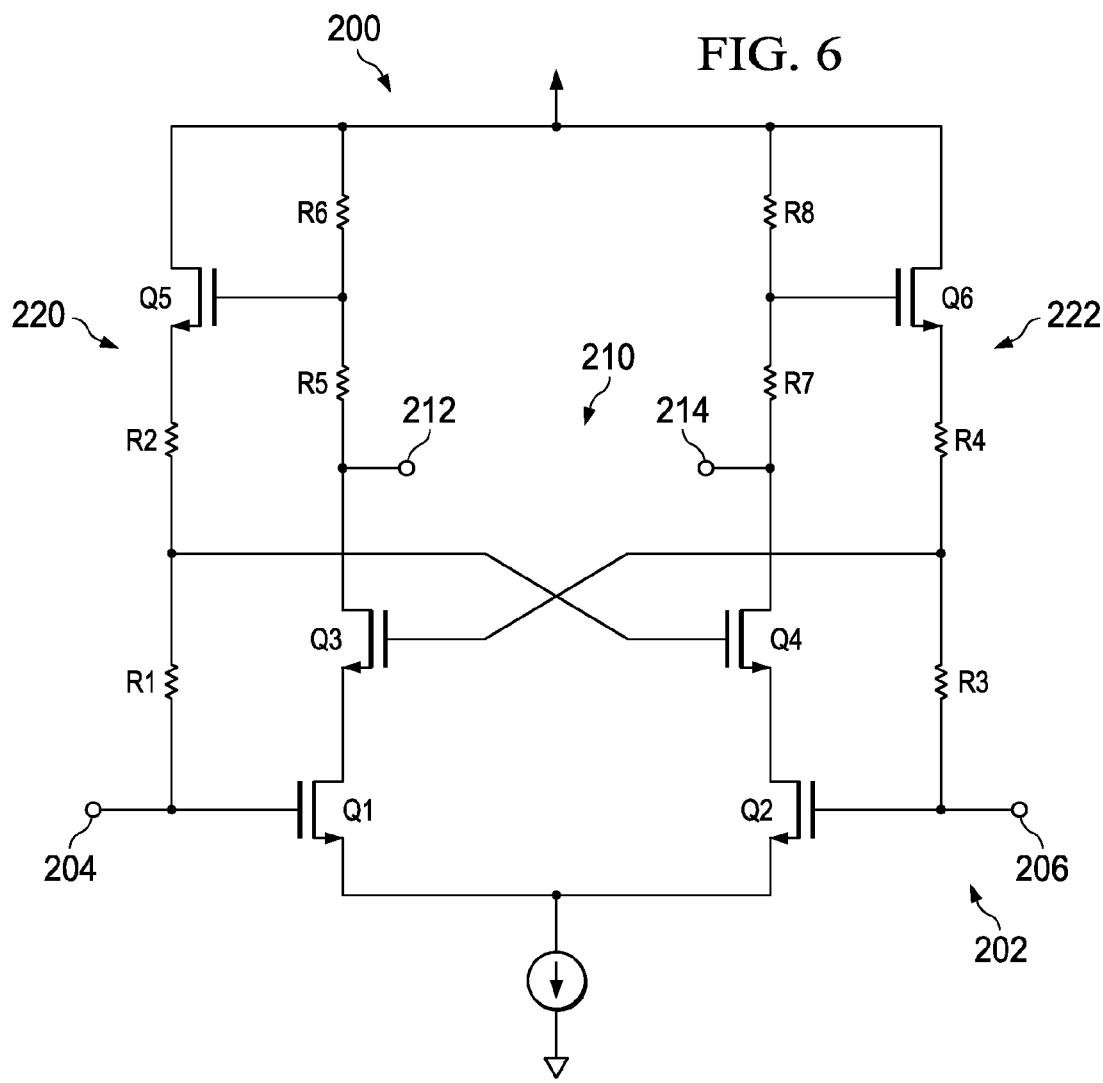
FIG. 6 is a more detailed schematic diagram of a differential amplifier using dynamically biased cascode stages to cancel the Miller effect in the amplifier.

The amplifier and methods of compensating for the Miller effect of FIG. 3 are applied to a more complex circuit as shown by the differential amplifier 150 of FIG. 4. A more detailed version of the amplifier 150 is shown in FIG. 6 and described in greater detail below. The amplifier 150 may be used to read and write data to and from the head of a disc drive, which is not shown herein. As the speed in which data is transferred to and from disc drives increases, the bandwidth of the drivers and amplifiers needs to increase. The Miller effect in amplifiers that drive the heads of disc drives reduces the bandwidth of the amplifiers, which reduces the speed at which disc drives can read and write data. The differential amplifier 150 described herein compensates for, or cancels, the Miller effect to provide an amplifier 150 with greater bandwidth. When used with a disc drive, the amplifier 150 provides for faster data transfer than conventional amplifiers.

The amplifier 150 has a differential input 152, which is further defined by a first input 154 and a second input 156. In some embodiments, the differential input 152 is connected or otherwise coupled to the read/write head of a hard disc drive, which is not shown herein. The first input 154 is referenced in FIG. 4 as a voltage source $V_{I1}$ that is connected to the gate of a transistor Q1. The second input 156 is referenced as a voltage source $V_{I2}$ and is connected to the gate of a transistor Q2. The input voltages $V_{I1}$ and $V_{I2}$ are differential inputs and may be out of phase with each other. In some embodiments, the input voltages $V_{I1}$ and $V_{I2}$ are one-hundred eighty degrees out of phase relative to each other.

The drain of the transistor Q1 is connected to the source of a transistor Q3 and the drain of the transistor Q2 is connected to the source of a transistor Q4. The transistors Q3 and Q4 are used for cascode biasing of the transistors Q1 and Q2. The drains of the transistors Q3 and Q4 are connected to the output 160 of the amplifier 150. More specifically, the drain of the transistor Q3 is connected to a first output 162 and the drain of the transistor Q4 is connected to a second output 164.

The amplifier 150 of FIG. 4 has a first voltage reference $V_{R1}$ and a second voltage reference $V_{R2}$. The voltage references $V_{R1}$ and $V_{R2}$ may be replaced by the input voltages as described in greater detail below with reference to FIG. 6. The first voltage reference $V_{R1}$ is in phase with the first voltage source $V_{I1}$ and the second voltage reference $V_{R2}$ is in phase with the second voltage source $V_{I2}$. The voltage reference VR1 and VR2 are dynamic, meaning that they change in response to the input voltages VI1 and VI2, unlike conventional cascode bias voltages that are fixed. Therefore, the reference voltages $V_{R1}$ and $V_{R2}$ can change in frequency and amplitude to offset the Miller effects in the transistors Q1 and Q2.

A resistor R1 is connected between a voltage source VDD and the drain of the resistor Q3 and a resistor R2 is connected between the voltage source VDD and the drain of the resistor Q4. A transistor Q5 is connected between the sources of the transistors Q1 and Q2 and a ground node. The transistor Q5 serves as a current source.

The amplifier 150 is subject to the Miller effect due to the Miller capacitance between the gates and drains of the transistors Q1 and Q2. The feedback to their respective cascode biasing transistors Q3 and Q4 compensates for the Miller effect and reduces the effects of the pole introduced by the Miller capacitance. The result is that the amplifier 150 operates with the pole of the Miller capacitance moved much higher in frequency, which gives it a greater bandwidth relative to conventional differential amplifiers. The amplifier 150 has been described above as being used with disc drives. It is to be understood that the amplifier 150 may be used with a plurality of different devices and is not limited to disc drives.

Having summarily described the operation of the amplifier 150, its operation will now be described in greater detail. A differential signal is received at the input 152. The differential signal has a first component that is input to the first input 152 and a second component that is input to the second input 154. The first and second components may be out of phase with each other. In the embodiments described herein, the first and second components are one-hundred eighty degrees out of phase with each other; however, they may have any phase difference, or they may be in phase.

The transistors Q1 and Q2 provide inverting amplification at their drains. Therefore, the voltages at the drains of the transistors Q1 and Q2 are one-hundred eighty degrees out of phase with the voltages at the gates of the transistors Q1 and Q2. The transistors Q3 and Q4 provide non-inverting gain between their gates and their sources. Therefore, the voltages at the sources of the transistors Q3 and Q4 are in phase with the voltages at their gates. With reference to the first input $V_{I1}$, the input voltage is in phase with the reference voltage $V_{R1}$. Therefore, the voltage from the source of the transistor Q3 cancels the voltage on the drain of the transistor Q1, which cancels the Miller effect on the transistor Q1. The same applies to second input $V_{I2}$, where the voltage at the drain of the transistor Q2 is cancelled by the voltage at the source of the transistor Q4. Accordingly, the Miller effects in the amplifier 150 are cancelled and the frequencies of the poles are not reduced, so the amplifier 150 operates at a high bandwidth.

Figure 5:
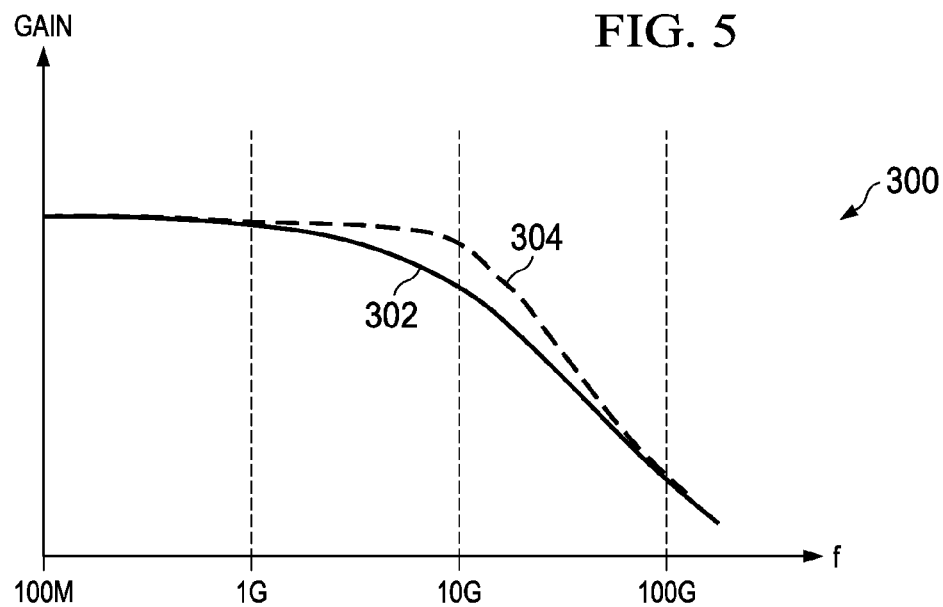
FIG. 5 is a graph showing gain performance of differential amplifiers with and without the Miller effect being cancelled.

Reference is made to the graph 300 of FIG. 5 to show gain and bandwidth performance of different amplifiers that use and do not use the Miller effect compensation described herein. The first gain 304 is an example of the gain of a conventional differential amplifier. The conventional differential amplifier may be a conventional Cherry Hooper device wherein the cascode biasing is fixed. Accordingly, the effects of the Miller capacitance can be seen by the low bandwidth relative to the other gains. The gain 304 is an example of the gain of the differential amplifier 150 where dynamic biasing on the cascode bias transistors Q3, Q4 has been applied. As shown, the bandwidth of the gain 304 is much greater than with the fixed cascode biasing on the gain 302.

The amplifier and methods of compensating for the Miller effect of FIG. 4 are applied to a more complex circuit as shown by the differential amplifier 200 of FIG. 6. The amplifier 200 is a more complex version of the amplifier 150 wherein feedback is applied for biasing of the cascode transistors. The differential amplifier 200 described herein compensates for or cancels the Miller effect to provide an amplifier 200 with greater bandwidth than with conventional amplifiers. When used with a disc drive, the amplifier 200 provides for faster data transfer than conventional amplifiers.

The amplifier 200 has a differential input 202, which is further defined by a first input 204 and a second input 206. In some embodiments, the differential input 202 is connected or otherwise coupled to the read/write head of a hard disc drive, which is not shown herein. The first input 204 is connected to the gate of a transistor Q1 and the second input 206 is connected to the gate of a transistor Q2. The drains of the transistors Q1 and Q2 are connected to sources of transistors Q3 and Q4, which are used for cascode biasing. The drains of the transistors Q3 and Q4 are connected to the output 210 of the amplifier 200. More specifically, the drain of the transistor Q3 is connected to a first output 212 and the drain of the transistor Q4 is connected to a second output 214.

The first input 204 is connected to a resistor R1 which is connected in series with a resistor R2. The junction of the resistors R1 and R2 is connected to the gate of the transistor Q4. The same configuration exists for the second input 206, which is connected to a resistor R3 that is connected in series with a resistor R4. The junction of the resistors R3 and R4 is connected to the gate of the transistor Q3. The resistors R1 and R2 provide resistive feedback dividers of the first input 204. Likewise, the resistors R3 and R4 provide resistive feedback dividers of the second input 206. The resistive feedback controls the level of feed back that is provided to the gates of the cascode biasing transistors Q3 and Q4. By controlling the feedback, the voltage swing at their sources can be controlled in order to compensate for or cancel the Miller effects of the transistors Q1 and Q2.

Resistors R1, R2, R5, and R6, along with a transistor Q5 provide secondary feedback of the first input 204 to the gate of the transistor Q4. The combination of components is referred to as the first feedback 220. Likewise, resistors R3, R4, R7, and R8 along with the transistor Q6 provide secondary feedback of the second input 206 to the gate of the transistor Q3. The combination of components is referred to as the second feedback 222. The first feedback 220 shifts the phase of the voltage at the first input 204 and feeds it to the gate of the transistor Q4. The second feedback 222 shifts the phase of the voltage at the second input 206 and feeds it to the gate of the transistor Q3. It follows that the voltage at the gate of the transistor Q3 is in phase with the voltage at the first input 204 and the voltage at the gate of the transistor Q4 is in phase with the voltage at the second input 206.

As described above, the input 202 voltage at the input 202 may be a differential voltage, so the voltage on the first input 204 is one-hundred eighty degrees out of phase with the voltage on the second input 206. Therefore, the voltage at the drain of the transistor Q1 is one-hundred eighty degrees out of phase with the voltage at the first input 204. The same occurs with the transistor Q2 in that the voltage at the drain is one-hundred eighty degrees out of phase with the voltage at the second input 206.

As described above, the differential amplifier 200 is subject to the Miller effect due to the Miller capacitance between the gates and drains of the transistors Q1 and Q2. The feedback to their respective cascode biasing transistors Q3 and Q4 compensates for the Miller effect and reduces the effects of the pole introduced by the Miller capacitance. More specifically, the voltage at the source of the transistor Q3 is in phase with the voltage at the input 204. Because the transistor Q1 is an inverting amplifier between the gate and the drain, the voltage at the drain will be cancelled by the voltage at the source of the transistor Q3. The same applies to the voltage at the input 206, which is in phase with the voltage at the source of the transistor Q4. The result is that the amplifier 200 operates with the poles of the Miller capacitances moved much higher in frequency, which gives the amplifier 200 a greater bandwidth relative to conventional differential amplifiers. The amplifier 200 has been described above as being used with disc drives. It is to be understood that the amplifier 200 may be used with a plurality of different devices and is not limited to disc drives.

The foregoing description of specific embodiments of Miller effect compensation has been presented for purposes of illustration and description. The specific embodiments described are not intended to be exhaustive or to suggest a constraint to the precise forms disclosed, and many modifications and variations are possible in light of the above teaching. The illustrated embodiments were chosen and described in order to best explain principles and practical application, to thereby enable others skilled in the art to best utilize the various embodiments with various modifications as are suited to the particular use contemplated. It is intended that the language of the claims appended hereto be broadly construed so as to cover different embodiments of the structures and methods expressly disclosed here, except as limited by the prior art.

What is claimed is:
1. An amplifier circuit comprising:
an input;
an output;
an amplifier connected between the input and the output;
a voltage source connected to the output, wherein the voltage source output is one hundred eighty degrees out of phase with the voltage output by the amplifier, and wherein the voltage source cancels gain due to the Miller effect of a Miller capacitance between the input and output;
wherein the voltage source comprises a transistor in cascode biasing with the amplifier, wherein the voltage at the gate of the transistor is in phase with the voltage at the input of the circuit;
wherein the voltage at the gate of the transistor in cascode biasing is coupled to the amplifier input.

2. A differential amplifier comprising:
a first input connected to the input of a first amplifier;
a second input connected to the input of a second amplifier;
a first cascode stage connected to the output of the first amplifier, the first cascode stage outputting a voltage that is substantially in phase with the voltage at the first input; and
a second cascode stage connected to the output of the second amplifier, the second cascode stage outputting a voltage that is substantially in phase with the voltage at the second input; and
a voltage scaling circuit connected between the second input and the first cascode stage.

3. A differential amplifier comprising:
a first input connected to the input of a first amplifier;
a second input connected to the input of a second amplifier;
a first cascode stage connected to the output of the first amplifier, the first cascode stage outputting a voltage that is substantially in phase with the voltage at the first input; and
a second cascode stage connected to the output of the second amplifier, the second cascode stage outputting a voltage that is substantially in phase with the voltage at the second input; and
a voltage scaling circuit connected between the first input and the second cascode stage.

4. A differential amplifier comprising:
a first input connected to the input of a first amplifier;
a second input connected to the input of a second amplifier;
a first cascode stage connected to the output of the first amplifier, the first cascode stage outputting a voltage that is substantially in phase with the voltage at the first input; and
a second cascode stage connected to the output of the second amplifier, the second cascode stage outputting a voltage that is substantially in phase with the voltage at the second input;
wherein the first amplifier comprises a first transistor wherein the drain of the first transistor is the output of the first amplifier, and wherein the first cascode stage comprises a second transistor, wherein the source of the second transistor is connected to the drain of the first transistor;
wherein the gate of the second transistor is coupled to the second input.

5. A differential amplifier comprising:
a first input connected to the input of a first amplifier;
a second input connected to the input of a second amplifier;
a first cascode stage connected to the output of the first amplifier, the first cascode stage outputting a voltage that is substantially in phase with the voltage at the first input; and a second cascode stage connected to the output of the second amplifier, the second cascode stage outputting a voltage that is substantially in phase with the voltage at the second input;

wherein the first amplifier comprises a first transistor wherein the drain of the first transistor is the output of the first amplifier, and wherein the first cascode stage comprises a second transistor, wherein the source of the second transistor is connected to the drain of the first transistor; and a feedback stage that is operative to shift the phase of the voltage at the second input one-hundred eighty degrees and, wherein the phase shifted voltage is applied to the gate of the second transistor.

6. A method for cancelling the Miller effect in a differential amplifier, the differential amplifier comprising a first inverting amplifier and a second inverting amplifier, the method comprising:

receiving a first signal at the input of the first inverting amplifier;

receiving a second signal at the input of the second inverting amplifier;

phase shifting the first signal by one-hundred eighty degrees;

phase shifting the second signal by one-hundred eighty degrees;

feeding the first phase shifted signal to the output of the second amplifier to cancel the Miller effect of the second amplifier; and feeding the second phase shifted signal to the output of the first amplifier to cancel the Miller effect of the first amplifier.

7. The method of claim 6, wherein:

the feeding the first phase shifted signal comprises feeding the first phase shifted signal to the gate of a transistor used in a first cascode biasing circuit; and the feeding the second phase shifted signal comprises feeding the second phase shifted signal to the gate of a transistor used in a second cascode biasing circuit.

\* \* \* \* \*